(12) United States Patent
Torres et al.

(10) Patent No.: US 10,088,522 B2
(45) Date of Patent: Oct. 2, 2018

(54) APPARATUS AND METHOD FOR DETECTING FAULTS IN MULTILAYER SEMICONDUCTORS

(71) Applicant: TOSHIBA MEMORY CORPORATION, Minato-ku (JP)

(72) Inventors: Juan Felipe Torres, Kawasaki (JP); Kei Matsuoka, Kawasaki (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 245 days.

(21) Appl. No.: 15/257,401

(22) Filed: Sep. 6, 2016

(65) Prior Publication Data
US 2017/0074928 A1 Mar. 16, 2017

(30) Foreign Application Priority Data

Sep. 16, 2015 (JP) ................................ 2015-182508

(51) Int. Cl.
*G01R 31/302* (2006.01)
*G01R 31/08* (2006.01)
(Continued)

(52) U.S. Cl.
CPC .............. *G01R 31/311* (2013.01); *G01R 1/07* (2013.01); *G01R 1/30* (2013.01); *G01R 31/26* (2013.01);
(Continued)

(58) Field of Classification Search
CPC ................ G01R 31/311; G01R 31/308; G01R 31/2851; G01R 31/26
(Continued)

(56) References Cited

U.S. PATENT DOCUMENTS

| 6,320,396 B1 | 11/2001 | Nikawa | |
| 2004/0212380 A1* | 10/2004 | Koyama | G01R 31/311 324/754.03 |

(Continued)

FOREIGN PATENT DOCUMENTS

| JP | 9-260286 A | 10/1997 |
| JP | 10-50784 A | 2/1998 |

(Continued)

OTHER PUBLICATIONS

Kiyoshi Nikawa, et al., "Failure Analysis Case Studies Using the IR-OBIRCH (Infrared Optical Beam Induced Resistance Change) Method" Test Symposium, 1999, 6 pages.

(Continued)

*Primary Examiner* — Amy He
(74) *Attorney, Agent, or Firm* — Oblon, McClelland, Maier & Neustadt, L.L.P.

(57) ABSTRACT

An apparatus according to embodiments detects locations of faults in a multilayer semiconductor (MLS). The apparatus comprises a laser source that outputs a laser beam, an optical system that directs the laser beam selectively onto a target region in the MLS to generate an irradiated zone in the MLS, a stage and a scanner that control a relative position between the irradiated zone and the MLS so that the irradiated zone moves along the target region, a controller system that measures electrical signals or electrical signal changes induced by a temperature increase in the MLS, and identifies a location of the target region and locations of faults in the MLS based on the measured electrical signal or the measured electrical signal changes. The target region is made of a material of which thermal conductivity is higher than that of a material around the target region and has a structure penetrating from shallow layers to deep layers of the MLS.

13 Claims, 14 Drawing Sheets

(51) Int. Cl.
*G01R 31/308* (2006.01)
*G01R 31/311* (2006.01)
*G01R 1/30* (2006.01)
*G01R 1/07* (2006.01)
*G01R 31/26* (2014.01)
*G01R 31/28* (2006.01)

(52) U.S. Cl.
CPC ....... *G01R 31/2851* (2013.01); *G01R 31/308* (2013.01)

(58) Field of Classification Search
USPC .............................. 324/754.21, 525, 750.23
See application file for complete search history.

(56) References Cited

U.S. PATENT DOCUMENTS

| | | | | |
|---|---|---|---|---|
| 2006/0280222 | A1* | 12/2006 | Nikawa | G01K 11/165 374/5 |
| 2007/0115003 | A1 | 5/2007 | Nikawa | |
| 2010/0021049 | A1* | 1/2010 | Nikaido | G01B 31/318511 382/149 |

FOREIGN PATENT DOCUMENTS

| | | |
|---|---|---|
| JP | 2005-300250 A | 10/2005 |
| JP | 2007-127499 A | 5/2007 |
| JP | 2010-197051 A | 9/2010 |
| JP | 2012-138456 A | 7/2012 |
| JP | 2012-222263 A | 11/2012 |
| JP | 2013-36953 A | 2/2013 |
| JP | 2013-104667 A | 5/2013 |
| JP | 2014-66527 | 4/2014 |
| JP | 2014-107483 A | 6/2014 |
| JP | 2014-175421 A | 9/2014 |
| JP | 2015-32686 A | 2/2015 |

OTHER PUBLICATIONS

H.W. Yang, et al., "Novel IR-OBIRCH Application in Gate Oxide Failure Analysis" Proceedings of 11th Physical and Failure Analysis of Integrated Circuits, 2004, pp. 299-302.

* cited by examiner

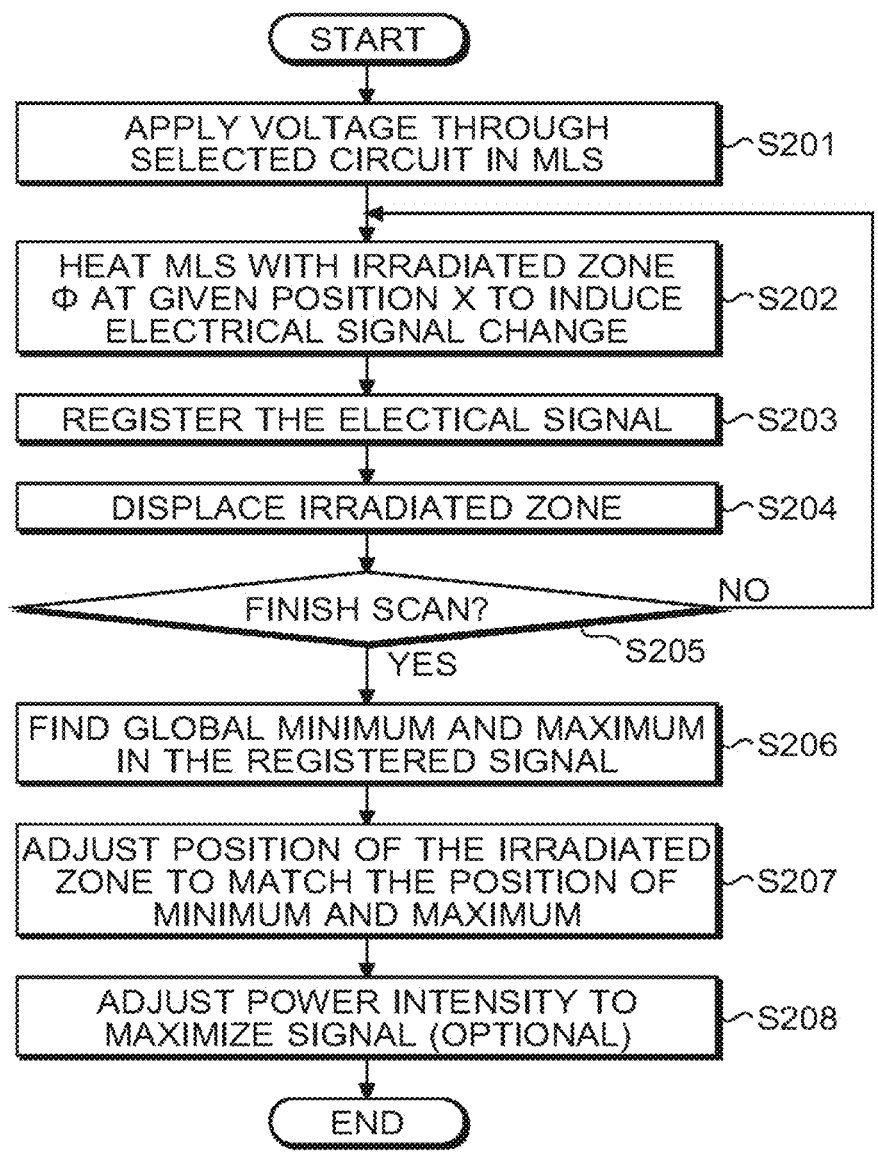

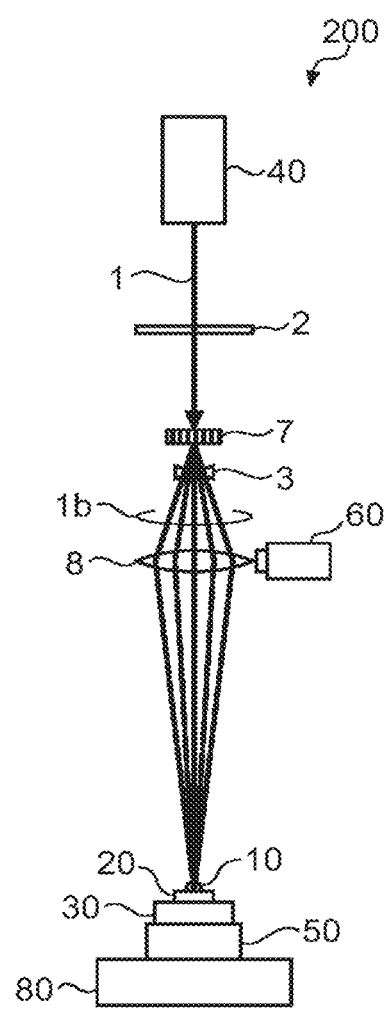

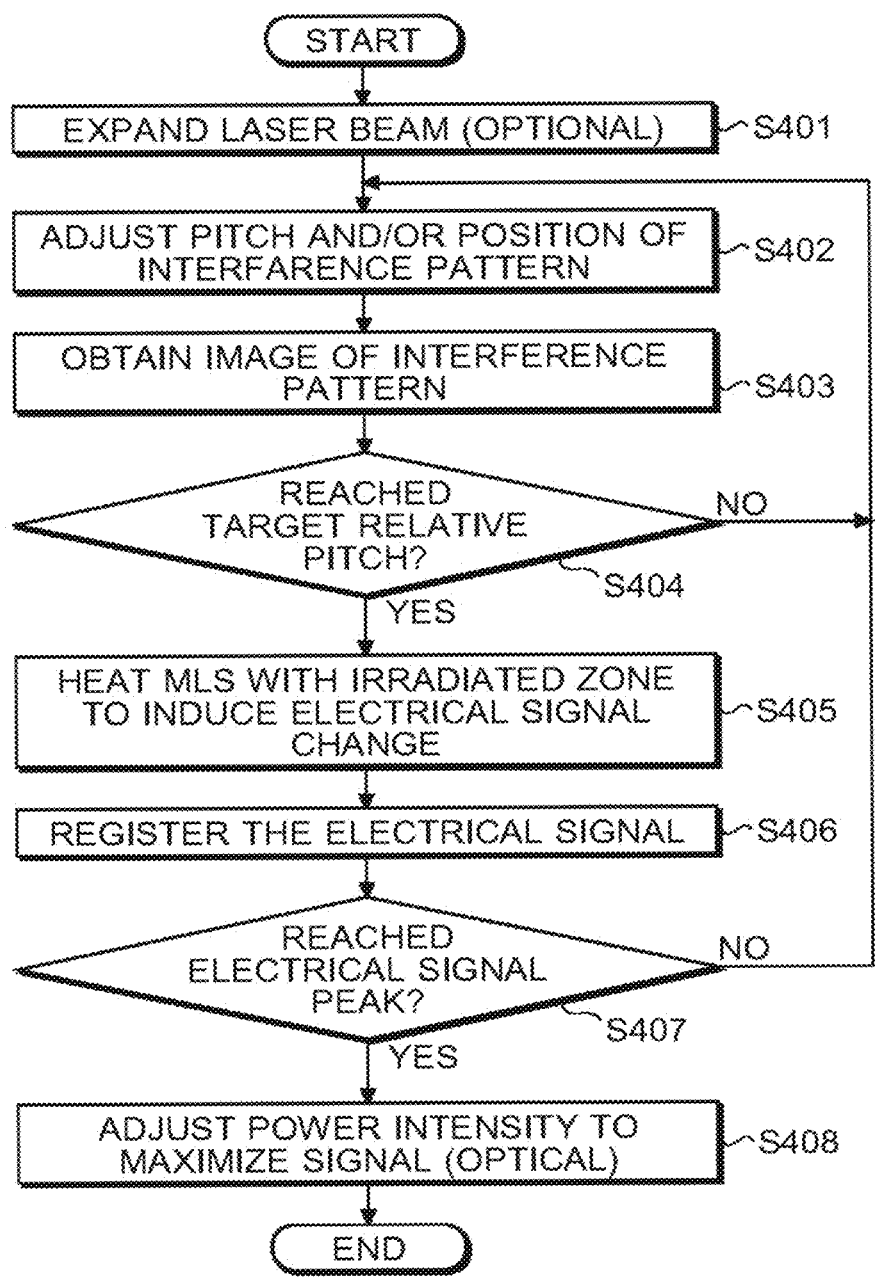

APPARATUS AND METHOD FOR DETECTING FAULTS IN MULTILAYER SEMICONDUCTORS

CROSS-REFERENCE TO RELATED APPLICATIONS

This application is based upon and claims the benefit of priority from Japanese Patent Application No. 2015-182508, filed on Sep. 16, 2015; the entire contents of which are incorporated herein by reference.

FIELD

Embodiments described herein relate generally to an apparatus and a method for detecting faults in multilayer semiconductors.

BACKGROUND

The rapidly growing demand for higher performance integrated circuits (ICs) has pushed the boundaries of photolithography to the nanometer scale, which has proven to be the limiting factor to further increasing the performance of ICs. On the other hand, multilayer stacking has shown to be a promising economical and reliable way to increase the transistor density in ICs and, hence, increase their overall performance. In recent years, for example, flash memory manufactures have started to produce three-dimensional multilayer NAND flash chips that will enable solid-state drives (SSDs) to reach terabyte levels at reasonable costs in the foreseeable future. Therefore, three-dimensional multilayer semiconductor devices (MLS) are considered to be the most significant advancement of very-large-scale integration (VLSI), and they will be an essential technology in the semiconductor industry for decades to come.

In semiconductor manufacturing, failure detection or identification of defect positions is an essential process for guaranteeing the reliability of the product and improving its yield. Therefore, failure detection techniques should be developed parallel to the advancements in semiconductor manufacturing. The first step to identify a fault in a defective chip is to determine its rough location ($10^{-3}$ meter order) with a nondestructive technique, such as Lock-in Thermography (LIT). Then, a more accurate nondestructive technique is used to detect the location of the fault ($10^{-6}$ meter order) before proceeding to cut the chip to find the exact location of the fault ($10^{-9}$ order) with a microscope, such as a Transmission Electron Microscope (TEM). Well-established accurate failure detection techniques include Laser Voltage Imaging (LVI) and Optical Beam Induced Resistance Change (OBIRCH). However, these techniques were initially developed for detecting faults in single-layer semiconductors, and numerous problems arise when trying to apply such techniques to MLS. For example, LVI is a technique based on the analysis of the reflected laser beam, which is usually reflected on the fir transistor layer; therefor LVI is not suitable to detect faults in deep layers of MLS. OBIRCH, on the other hand, is a technique that directs an infrared laser beam onto the chip and measures the electrical resistance change caused by an increase of temperature; the laser-induced electrical resistance changes are significantly different for faulty locations than for functional locations. Even though the infrared light is usually absorbed in the shallow transistor layers (or first layer for a single-laver semiconductor), the accumulated heat in these shallow layers is transported to the deep layer by heat conduction. This process results in an increase of temperature in the deep layers where faults can exist, and if the temperature rise at a fault is high enough then anomalous electrical resistance changes in MLS could be detected, i.e., the fault location can be determined.

BRIEF DESCRIPTION OF THE DRAWINGS

FIG. 6 is a flowchart of a beam alignment method according to the first embodiment;

FIG. 7 is a schematic diagram showing an optical system according to a second embodiment;

FIG. 12 is a flowchart of a beam alignment method according to a third embodiment;

DETAILED DESCRIPTION

Figure 1:
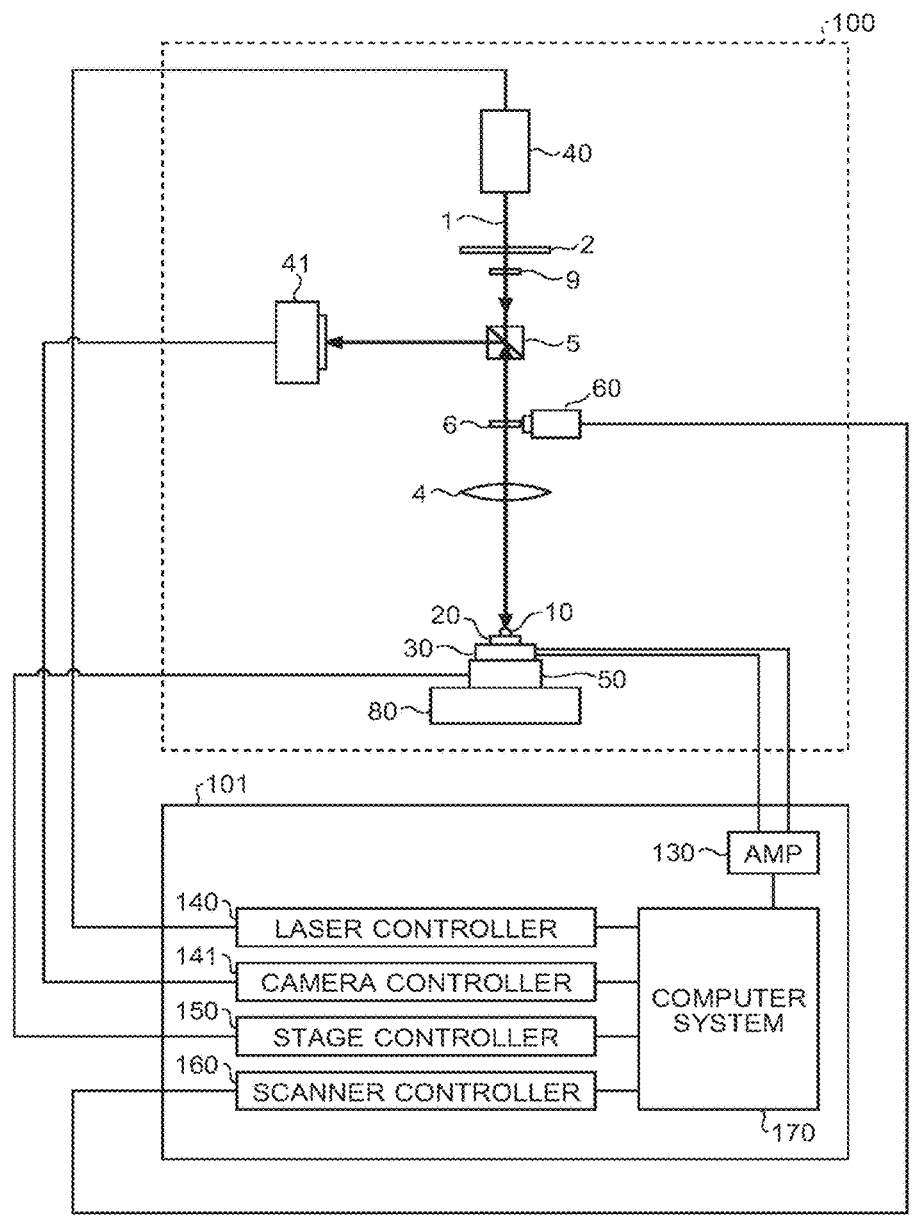
FIG. 1 a schematic diagram showing an optical system and a controller system according to a first embodiment.

The presently disclosed subject matter will be described more fully hereinafter with reference to the accompanying Drawings wherein like numbers refer to like elements throughout. Not all embodiments of the inventions are shown; the presently disclosed subject matter may be embodied in many different forms and should not be constructed as limited to the embodiments set forth herein. Indeed, many modifications and other embodiments of the presently disclosed subject matter set forth herein will come to mind to one skilled in the art related to the presently disclosed subject matter. The detailed embodiments disclosed with this invention serve as examples of possible setups to heat the preselected target region.

Applying conventional OBIRCH to MLS may have the following major problems.

Firstly, heat may diffuse from the irradiated zone to its surroundings in a sphere-like manner, i.e., temperature drop is approximately directly proportional to the square of the distance from the center of the irradiated zone (heat source). Such temperature drop significantly decreases the possibility of detecting faults in deep layers due to very small anomalous electrical resistance changes.

Secondly, the precision of the measurement may decrease because heat diffuses both laterally and vertically, i.e., heat diffuses from the shallow layers to the deep layers but also along the layers. Therefore, this heat diffusion tends to flatten the temperature profile in deep layers resulting in an increase of the area where the fault is detected by the anomalous electrical resistance change, and the increase of this area decreases the precision of the measurement. This problem is more prominent as the location of the fault becomes deeper.

Thirdly, there may be a drop of measurement accuracy due to the spatial shift between the hottest location in the deep layers and the location of the irradiated zone on the first layer. The special shift is intrinsic to a moving source. This problem may also worsen as the location of the fault becomes deeper.

It would therefore be advantageous to provide an alternative noninvasive thermal-stimulation based apparatus and a method for detecting the location of faults in deep layers of MLS, and/or detecting the depth of these faults. If such method is available, it could be implemented to improve the manufacturing process and the yield of MLS This would also allow the manufacturers to increase the number of layers of MLS and, hence, increase the functionality and performance of such devices.

The foregoing problems are overcome, to a great extent, by the following embodiments, wherein an apparatus and method for determining the location and depth of faults and/or defects in a multilayer semiconductor (MLS) including determining the area of interest, where the fault is more likely to exist. The apparatus comprises a laser beam to selectively heat MLS, an optical system to direct the beam to preselected target regions in MLS, an amplifier to increase the thermally induced electrical signal change, and a computer system with controllers to control the foregoing setup and register the electrical signal changes obtained from MLS. Additionally, this disclosure includes two methods for aligning the laser-induced irradiated zone (heat source) with the preselected target region, and one method for detecting the location of the fault in a MLS. The latter method also includes detecting the depth of the fault after locating it on the wider plane of MLS.

FIRST EMBODIMENT

Firstly, an apparatus and a method for detecting faults in multilayer semiconductors according to a first embodiment will be described in detail with reference to the accompanying drawings.

FIG. 1 shows an arrangement of an optical system 100 and a controller system 101 according to the first embodiment. The optical system 100 is used to manipulate a laser beam 1 and comprises a laser source 40, a polarizing plate 2, a quarter-wave plate 9, a beam splitter 5, a camera 41, an optical element 6, a scanner 60, a lens 4, a lens 10, a MLS 20, a circuit board 30, a stage 50, and a stand 80. The controller system 101 is used to control several elements in the optical system 100 and to record the electric, signal changes measured from the MLS 20, and comprises an amplifier 130, a laser controller 140, a camera controller 141, a stage controller 150, a scanner controller 160, and a computer system 170.

In the optical system 100, the laser beam 1 is generated with the laser source 40. The laser beam 1 could pass through a polarizing plate 2 in order guarantee a desired linear polarization state; if the linear polarization state of the laser beam 1 is known just after exiting the laser source 40, then the polarizing plate 2 could be omitted. Moreover, the linear polarization state of the laser beam 1 could be changed to circular polarization with a quarter-wave plate 9; in this case the polarization angle of the incident laser beam 1 is adjusted to n/4 with respect to a virtual axis perpendicular to an optic axis, meanwhile an extraordinary axis of the quarter-wave plate 9 is parallel to the virtual axis.

The laser beam 1 then passes through a beam splitter 5, which can also be a polarizing beam splitter or any kind of prism (the beam splitter is later used to capture reflected or emitted light from the MLS 20).

The laser beam 1 then passes through the optical element 6 that is used to scan an irradiated zone on the MLS 20. The optical element 6 can be a flat plate, a mirror, a lens, or any other element that can be used for scanning the laser beam 1. The optical element 6 is manipulated with the scanner 60, which in turn is manipulated with the scanner controller 160 that can comprise a Piezo element and/or a servo motor and/or a stepper motor and/or a linear motor.

The laser beam 1 then passes through the lens 4 in order to be directed to the lens 10 and then to the MLS 20. The lens 4 can be any one of, or a combination of, one or more concave lenses and/or one or more convex lenses and/or one or more objective lenses. The lens 10 can be a solid immersed lens (SIL) or any derivative in order to modify the numerical aperture of the optical system 100. The diameter of the laser beam 1 can then be modified according to Equation (1).

$$\phi = 1.22 \, \lambda/NA \tag{1}$$

In Equation (1), $\phi$ is the diameter of the irradiated zone created by the incidence of the laser beam 1 on the shallow layers of the MLS 20, $\lambda$ is a wavelength of the laser beam 1, and NA is the numerical aperture of the optical system 100. Equation (1) is formulated according to an ideal Airy disk intensity distribution on the shallow layers. The wavelength of the laser beam 1 is usually in the infrared region to reduce the absorption in a substrate 25 (see FIG. 3B) of the MLS 20. Moreover, a NA and $\lambda$ in the optical system 100 should be selected according to a size of each of preselected target region, i.e., the size of the irradiated zone $\phi$ should be around the same size as each of the preselected target regions.

Furthermore, as shown in FIG. 1, the MLS 20 is mounted on the circuit board 30 wherein different pins of peripherals of the MLS 20 are wired to the circuit board 30. The circuit board 30 is used to apply a constant or variable voltage difference along one path in the MLS 20 or multiple paths in the MLS 20, wherein these paths may include individual layers of the MLS 20 in order to detect a depth of each failure. The circuit board 30 is connected to the amplifier 130, and this circuit board 3C is fixed on the stage 50. The stage 50 is used to control a spatial location of the MLS 20 in the optical system 100; the spatial location can be controlled in any of three Cartesian coordinates. Moreover, the stage 50 is mounted on the stand 80, which can comprise damping features in order to isolate the optical system 100 from external vibrations that can potentially affect measurement accuracy.

A central component of the controller system 101 shown in FIG. 1 is the computer system 170. The computer system 170 controls (i) switching of the laser beam 1 through the laser controller 140, (ii) scanning of the laser beam 1 through the scanner controller 160, (iii) switching and reading of/from the camera 41 through the camera controller 141, and (iv) locating the MLS 20 in the optical system 100 through the stage controller 150.

The computer system 170 also controls voltage characteristics to be applied to the MLS 20 through the amplifier 130; the computer system 170 reads and registers amplified electrical signal change from the amplifier 130. The electrical signal change is due to the electrical resistance change induced by a temperature increase in the MLS 20.

Figure 2:
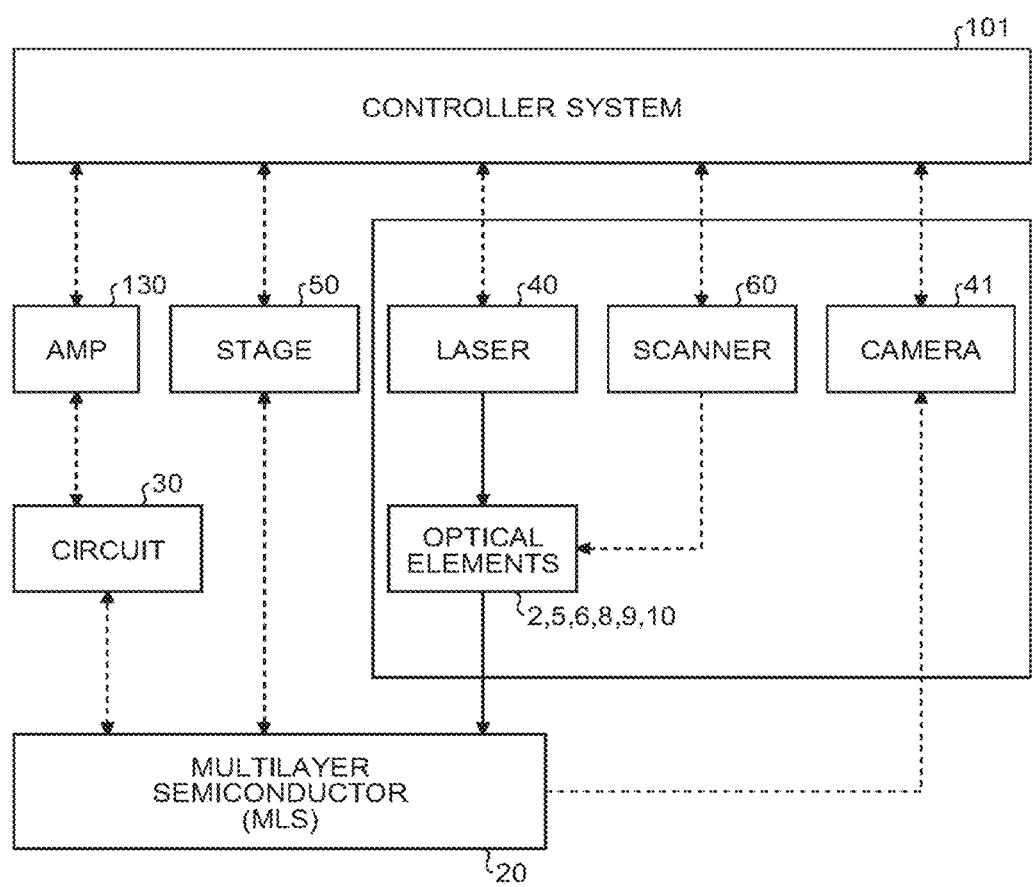
FIG. 2 is an illustration showing connections between components in the optical system and components in the controller system according to the first embodiment.

FIG. 2 shows an illustration showing connections between the components in the optical system 100 and the components in the controller system 101. The optical system 100 can be built according to multiple arrangements, three of which are described as embodiments in this disclosure.

Figure 3A:
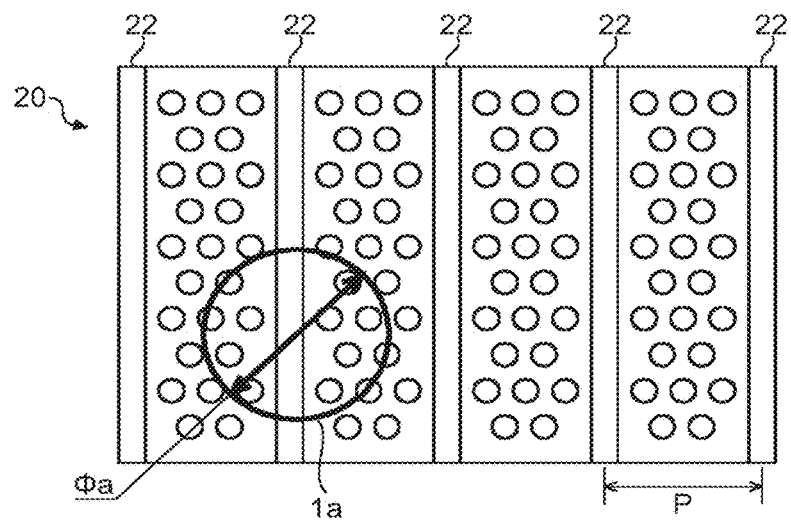
FIG. 3A is an upper-view schematic diagram of a multilayer semiconductor (MLS) according to the first embodiment.

FIG. 3A shows an upper view of a schematic diagram of a typical multilayer flash memory chip and an irradiated zone 1a that is generated due to the incidence of the laser beam 1 onto a multilayer zone 26. In the first embodiment, a typical multilayer flash memory structure is used as a general example of the MLS 20; however, the first embodiment and other embodiments described in this disclosure are applicable to detect faults in any MLS that has a periodic structure and whose structure comprises materials of different thermal conductivity.

Figure 3B:
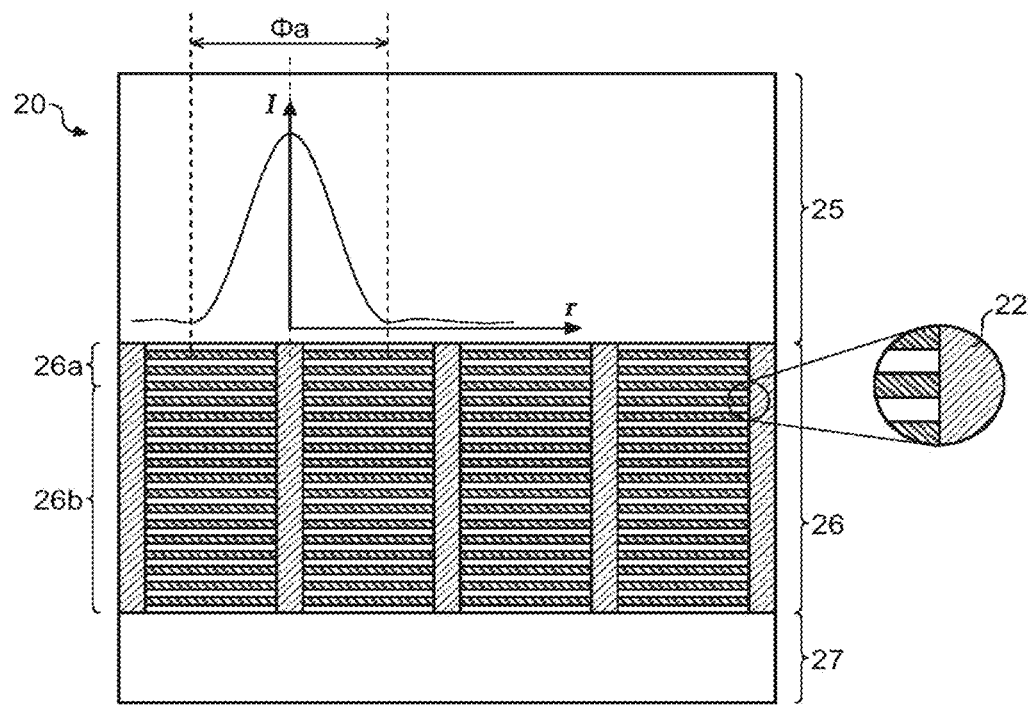
FIG. 3B is a lateral-view schematic diagram of the MLS according to the first embodiment.

FIG. 3B shows a lateral view schematic diagram of the MLS 20. An intensity of the irradiated zone la on a shallow layers 26a of the MLS 20 is also shown in FIG. 3B, which corresponds to the upper view of the MLS 20 shown in FIG. Note that in FIG. 38 a maximum irradiation location overlaps with a position of a preselected target region. In this example, the preselected target region corresponds to a vertical structure 22 that is visible in the upper view shown in FIG. 3A.

The preselected target region was chosen because it consists of relatively high thermal conductivity material and it has a structure that extends from shallow layers 26a to deep layers 26b of the NILS 20, as shown in FIG. 3B. In FIG. 3B, a substrate layer 25 (usually made of one material), a bulk of a multilayer zone 26 (made of multiple materials), and a bulk of circuit layers 27 (made of multiple materials) are also shown.

One of the preselected target regions may be a separator layer 22 for separating blocks of a multilayer flash memory chip. Such separator layer is typically made of a material with high thermal conductivity such as metal or alloy, and has a structure penetrating from shallow layers 26a to deep layers 26b of a MLS. Therefore, by heating a shallow part of the separator layer, it is possible to heat a deep part of the separator layer, and thereby, it is possible to effectively heat the deep layers of the MLS.

The first embodiment is primarily directed to detect faults in the deep layers 26b, but it can also detect faults in the shallow layers 26a. Since infrared irradiation is highly absorbed by different materials in the circuit layers 27, then the laser beam 1 is preferably directed through the substrate layer 25, which is usually made of one material semi-transparent against the wavelength λ of the laser beam 1.

Figure 4A:
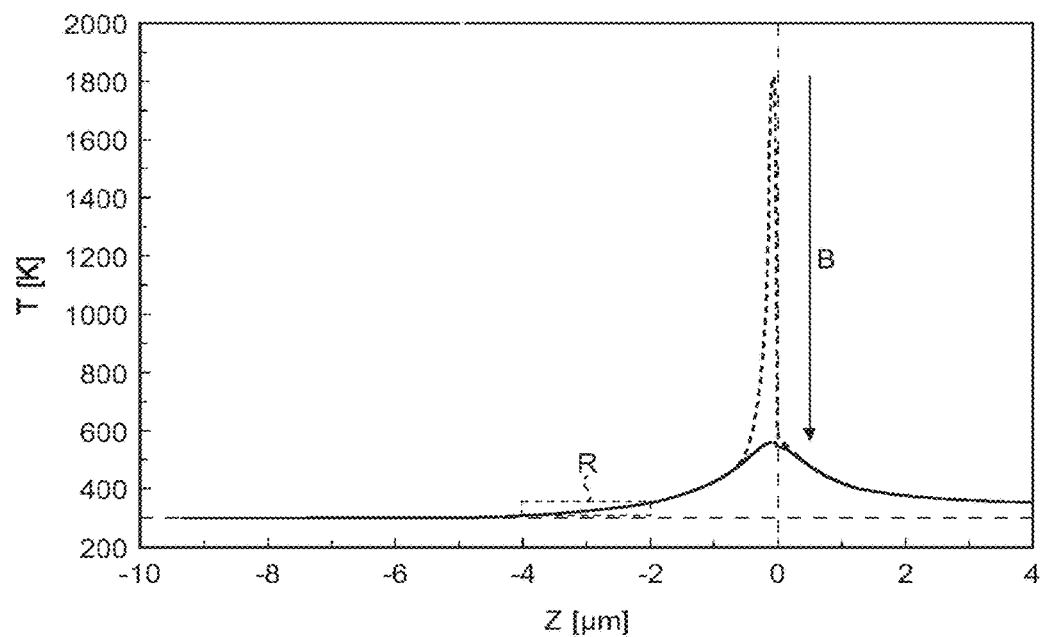
FIG. 4A is an illustration showing results of a numerical calculation according to the first embodiment.
Figure 4B:
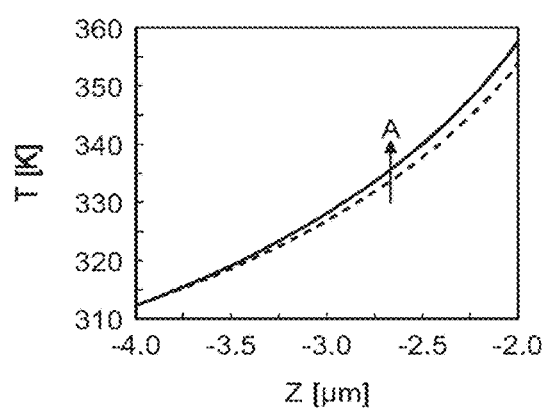
FIG. 4B is an extended figure of an area R in FIG. 4A.
Figure 5A:
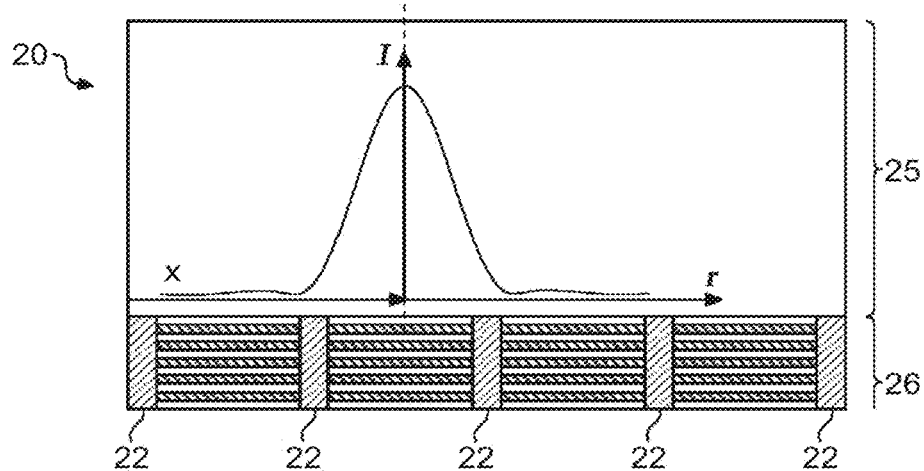
FIG. 5A is a lateral-view schematic diagram of the MLS in a misaligned case in the first embodiment.
Figure 5B:
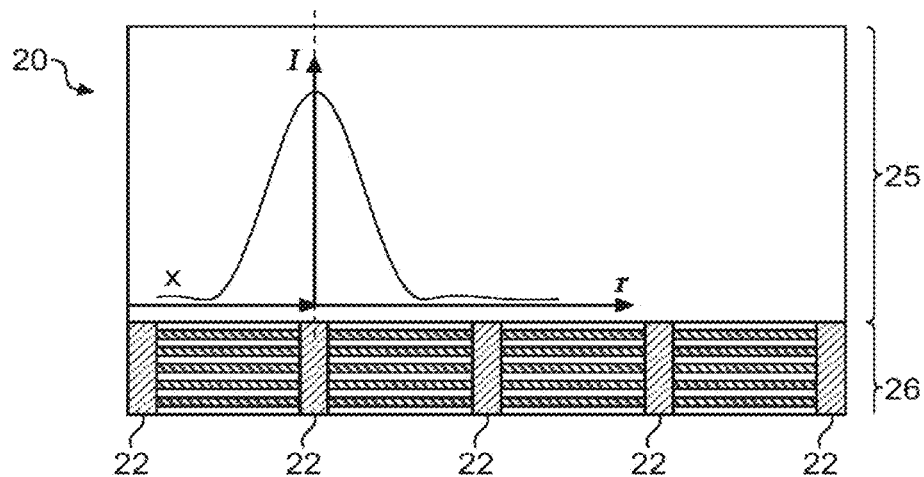
FIG. 5B is a lateral-view schematic diagram of the MLS in an aligned case in the first embodiment.

As stated in the first embodiment, the incidence of the irradiated zone 1a on the preselected target region 22 has multiple advantageous effects. FIG. 4A shows results of a numerical calculation that highlights two important advantageous effects of the first embodiment, and FIG. 4B is an extended figure of an area R in FIG. 4A. In FIGS. 4A and 4B the abscissa axis is the vertical position in the MLS 20, where $z>0$ is a substrate region, $z<0$ is a multilayer region, and $z=0$ is a boundary between the substrate region and the multilayer region; and the ordinate axis in FIGS. 4A and 4B is the temperature. These numerical results show the vertical temperature profiles in the MLS 20 for a misaligned irradiated zone (dashed lines) and an alignment irradiated zone (solid lines). An example of misaligned and aligned irradiated zones is shown in FIGS. 5A and 5B, respectively.

Two advantageous effects of the first embodiment are highlighted in FIGS. 4A and 4B: one advantageous effect A is that a temperature of the deep layers 26b in the MLS 20 is increased, and the other advantageous effect B is that a temperature of the shallow layers 26a in the MLS 20 is decreased.

The advantageous effect A (as highlighted in FIG. 4B) indicates that by heating the preselected target region, the electric signal changes are amplified according to a temperature increase in the deep layers 26b, when a voltage for generating a current is applied to MLS 20. An amplified electric signal increases the sensitivity and/or accuracy of the measurement, as suggested in FIG. 5C, where the abscissa axis indicates the displacement x of the irradiated zone parallel to the vertical structures 22 and the ordinate axis indicates the electric signal or electric signal change. Therefore, the advantageous effect A results in an improvement of sensitivity and/or accuracy of the measurement for faults located in deep layers 26b of a MLS.

The advantageous effect B (as highlighted in FIG. 4A) consists on a significant drop of temperature in the shallow layers 26a. Therefore, we can further increase the power of the laser beam 1 without damaging the sample in the case where an electric signal read from the MLS 20 is to weak, e.g., the maximum and the minimum in FIG. 5C could be undetectable due to the noise. Therefore, a further more of power of the laser beam 1, which is allowed by the advantageous effect B, would result in an improvement of the sensitivity and/or accuracy of the measurement for faults located in deep layers 6b of a MLS.

Figure 5C:
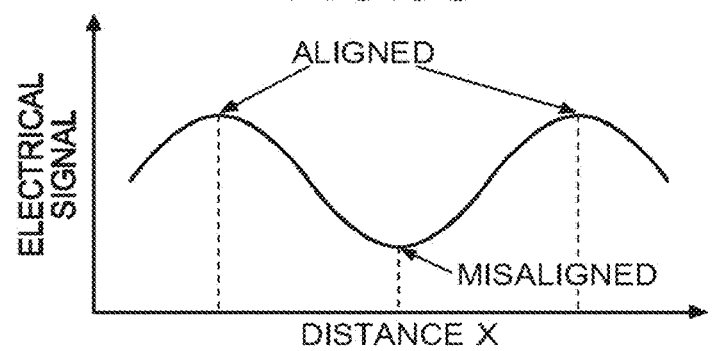
FIG. 5C is an illustration showing an expected variation of electrical signal (without noise) measured as an irradiated zone is displaced along a position x.

FIG. 5C shows that if the center of the irradiated zone is placed on the preselected target region, then the electrical signal becomes larger; in contrast, if the center of the irradiated zone between adjacent vertical structures 22, then the electrical signal becomes weaker. The operator should have prior knowledge of the structure of the MLS 20 to judge whether the electric resistivity of the overly heated material is directly or inversely proportional to the temperature. For example, if the electric resistivity of the material of the vertical structures 22 were inversely proportional to the temperature, then the aligned configuration would correspond to the position where the electric resistivity is a minimum, i.e., according to Ohm's law the electrical signal becomes a maximum, as shown in FIG. 5C. Note that the noise in th electrical signal shown in FIG. 5C is omitted.

Next, an operation of aligning the center of the irradiated zone with the preselected target region in the first embodiment will be described with reference to FIG. 6. Preliminarily, the operator performs preparations that include, but are not limited to, fixing the optical elements on a frame of the optical system 100, administrating power supply to the controller system 101, adjusting a size of the irradiated zone to that of the preselected target region, and so forth.

In the operation, as shown in FIG. 6, firstly, in step S201, the controller system 101 applies a constant or variable voltage through a selected circuit path of the MLS 20. Then proceed to step S202, the controller system 101 heats the shallow layers 26a of the MLS 20 with the irradiated zone at a given location x. Then proceed to step S203, the controller system 101 registers electrical signal or electrical signal changes inputted via the amplifier 130. Then proceed to step S204, the controller system 101 displaces the irradiated zone on the shallow layers 26a of the MLS 20. Then proceed to step S205, the controller system 101 verifies whether scan of every scan path was finished. When the scan was not finished, the controller system 101 returns to step S202. When the scan was finished, i.e., when electric signal changes (with noise) have been obtained from every scan paths as those shown in FIG. 5C, the controller system 101 proceeds to step S206.

In step S206, the controller system 101 finds global minimum and maximum in the registered signals. Then proceed to step S207, the controller system 101 adjusts the position of the irradiated zone to match the position where the signal becomes minimum or maximum. The choice of whether to use the position where the signal becomes minimum or maximum as a position of a target region depends on the temperature dependence of an electric resistance of the material that composes the preselected region. If the target region is composed of a material that increases its thermal conductivity with increasing temperature, i.e., direct proportionality, then the aligned position would correspond to a minimum of the signal output. On the other hand, if the target region is composed of a material that decreases its thermal conductivity with increasing temperature, i.e., inverse proportionality, then the aligned position would be a maximum of the signal output, as the case shown in FIG. 5C.

Then proceed to step S208, the controller system 101 adjusts the power intensity as to maximize the electric signal or electric signal change. This adjustment is optional and takes into consideration the advantageous effect B that allow an increase of the laser power without damaging the MLS 20, as indicated in FIGS. 4A.

In this way, the alignment of the first embodiment for scanning th MLS 20 to find the location if the possible fault is performed. Note that the scan is done along the structure of interest (i.e., the target regions) as shown in FIG. 3A and also shown in FIGS. 8 and 11.

According to the first embodiment described above, it is possible to provide the alternative noninvasive thermal-stimulation based apparatus and method capable of improving the manufacturing process and the yield of MLS by detecting the location of faults in deep layers of MLS, and/or detecting the depth of these faults. This would also allow the manufacturers to increase the number of layers of MLS and, hence, increase the functionality and performance of such devices.

SECOND EMBODIMENT

Next, an apparatus and a meth d for detecting faults in multilayer semiconductors according to a second embodiment will be described in detail with reference to the accompanying drawings.

An arrangement of an optical system according to the second embodiment is shown in FIG. 7 wherein a controller system and an observation system of the laser beam 1 are omitted and can correspond to the controller system 101 and an observation system constructed from the beam splitter 5 and the camera 41 shown in FIG. 1. Furthermore, in the second embodiment, to the same structures as those of the first embodiment, the same reference numbers will be applied, and the redundant explanations thereof will be omitted.

The optical system 200 according to the second embodiment is used to manipulate a laser beam 1 and comprises a laser source 40, a polarizing plate 2, a diffraction orating 7, a convex lens 3, a concave lens 8, a solid immersion lens 10, a MLS 20, a circuit board 30, a stage 50, a stand 80, and a scanner 60. In the second embodiment, the lens 8 is used to redirect the laser beam 1 in scanning process. In the second embodiment, the lens 8 can be replaced with a plate and/or a mirror and/or any other element capable of scanning the laser beam 1.

The second embodiment has the diffraction grating 7 to increase the number of incident beams (i.e., diffracted laser beams) on the preselected target region in the MLS 20. As an upper- and lateral-view of the MLS 20 shown in FIG. 8, by having such structure, it is possible to simultaneously heat multiple preselected target regions (i.e., the vertical structures 22) using the multiple diffracted laser beams 1b, and thereby, an enhancement of the advantageous effects A and B (see FIGS. 4A and 4B) becomes possible. Moreover, although a horizontal pitch of the diffracted laser beams 1b must not necessarily match a distance between adjacent vertical structures 22, the horizontal pitch should be a multiple of the distance between adjacent vertical structures 22.

Next, an operation of aligning centers of the irradiated zones with the preselected target regions in the second embodiment will be described with reference to FIG. 9. In the second embodiment, as the first embodiment, the operator performs preliminarily preparations that include, but are not limited to, fixing the optical elements including the diffraction grating 7 on a frame of the optical system 200, administrating power supply to the controller system 101, adjusting sic of the irradiated zones to those of the preselected target regions, and so forth.

The operator further performs a physical adjustment that includes, but is not limited to, rotating the diffraction orating 7 to adjust the horizontal pitch of the diffracted laser beams 1b. Another physical adjustment could be simply to change the diffraction grating 7 to obtain the desired pitch. Another physical adjustment could be to rotate the MLS 20 (manually or with the stage 50) while the diffraction grating 7 is fixed.

Figure 9:
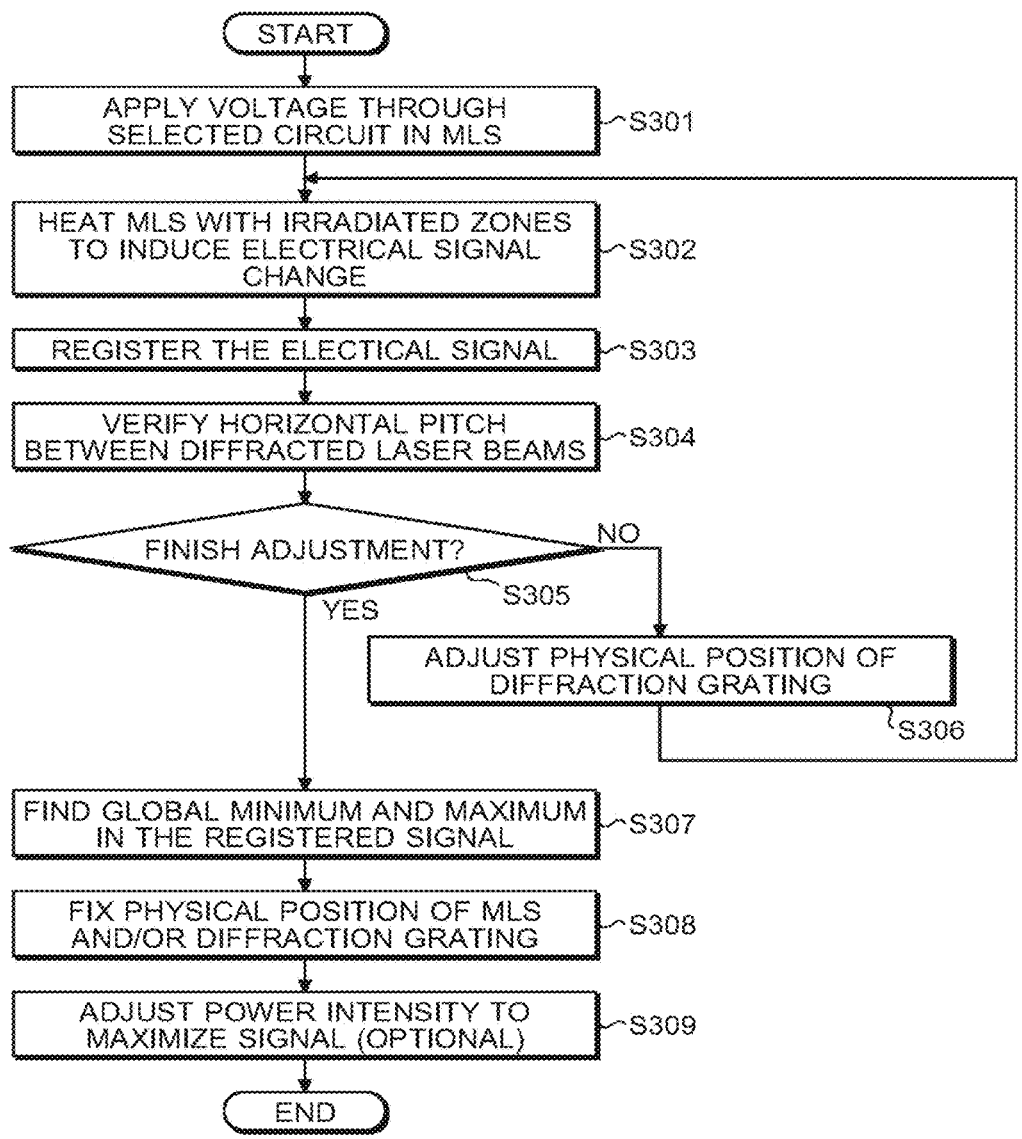
FIG. 9 is a flowchart of a beam alignment method according to the second embodiment.

In the operation, as shown in FIG. 9, firstly, in step S301, the controller system 101 applies a constant or variable voltage through a selected circuit path of the MLS 20. Then proceed to step S302, the controller system 101 heats the shallow layers 26a of the MLS 20 with the irradiated zones. Then proceed to step S303, the controller system 101 registers electrical signals or electrical signal changes inputted via the amplifier 130. Then proceed to step S304, the controller system 101 verifies whether the horizontal pitch between the diffracted laser beams 1b matches a desired pitch. This verification may be done based on an image taken by the camera 41. This verification could also be done through visual confirmation using a microscope or through reading the registered signal change while conducting the physical adjustment.

When the horizontal pitch between the diffracted laser beams 1b matches the desired pitch, the controller system 101 determines that the adjustment of the horizontal pitch between the diffracted laser beams 1b is finished (step S305; YES), proceeds to step S307. On the other hand, when the horizontal pitch does not match the desired pitch, the controller system 101 determines that the adjustment of the horizontal pitch is not finished (step S305; NO), conducts step S306, and returns to step S302.

In step S306, a physical position of the diffraction grating 7 is adjusted so that the horizontal pitch between the diffracted laser beams 1b matches the desired pitch. This adjustment may be done by the operator. If the optical system 200 has an attitude control system, or the like, of the diffraction grating 7, the adjustment may be done by such system based on a control from the controller system 101.

In step S307, the controller system 101 finds global minimum and maximum in the registered signals. Then proceed to step S308, the controller system 101 fixes the physical positions of the MLS 20 and/or the diffraction grating 7 in order to overlap the irradiated zones with preselected target regions.

Then proceed to step S309, the controller system 101 adjusts the power intensity so as to maximize the electric signals or electric signal changes. This adjustment is optional as the first embodiment.

In this way, the alignment of the second embodiment for scanning the MLS 20 to identify the location of the possible fault is performed.

Figure 8:
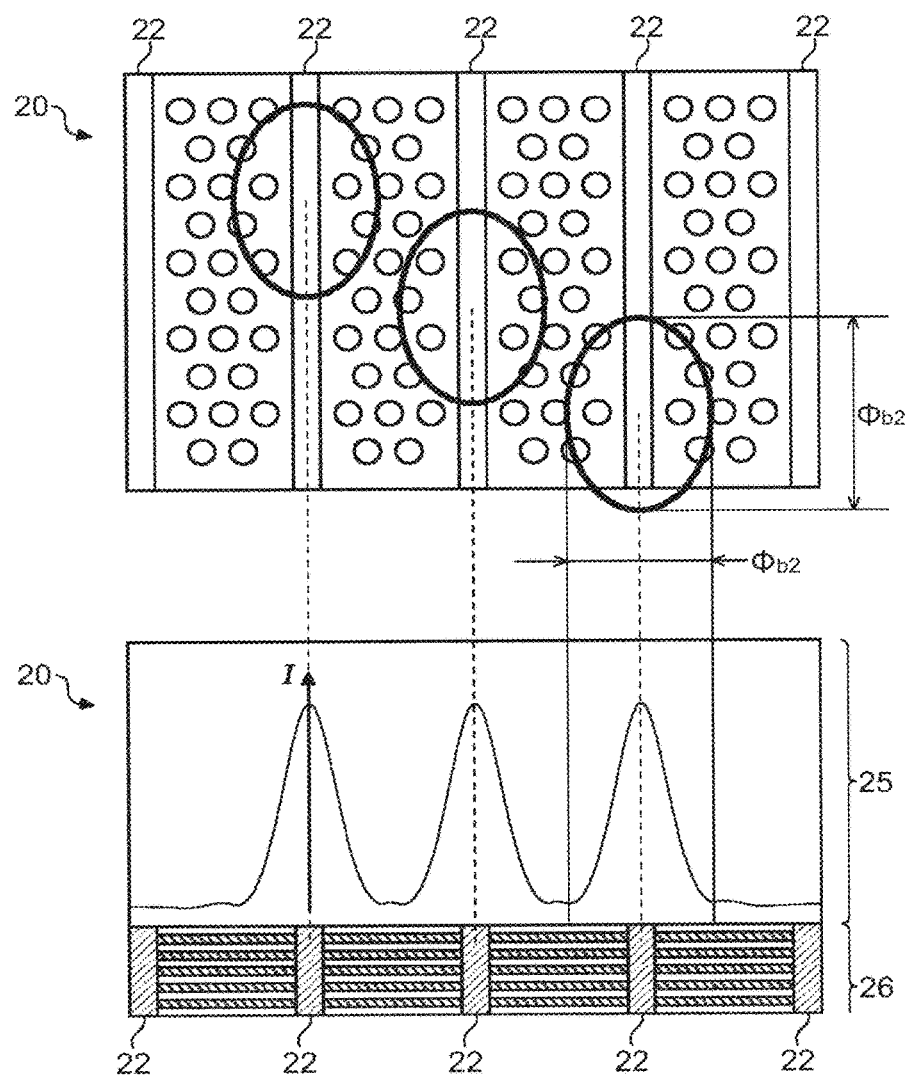
FIG. 8 is upper- and lateral-view schematic diagrams of the MLS according to the second embodiment.

Here, after step S309, it i possible to set a lens that expands the irradiated zones along the preselected target regions, as for example shown in FIG. 8 with the ellipsoid-like beams. Not that the setting of he lens is optional and could also be incorporated in the alignment process for the first embodiment.

THIRD EMBODIMENT

Next, an apparatus and a meth d for detecting faults in multilayer semiconductors according to a third embodiment will be described in detail with reference to the accompanying drawings.

Figure 10:
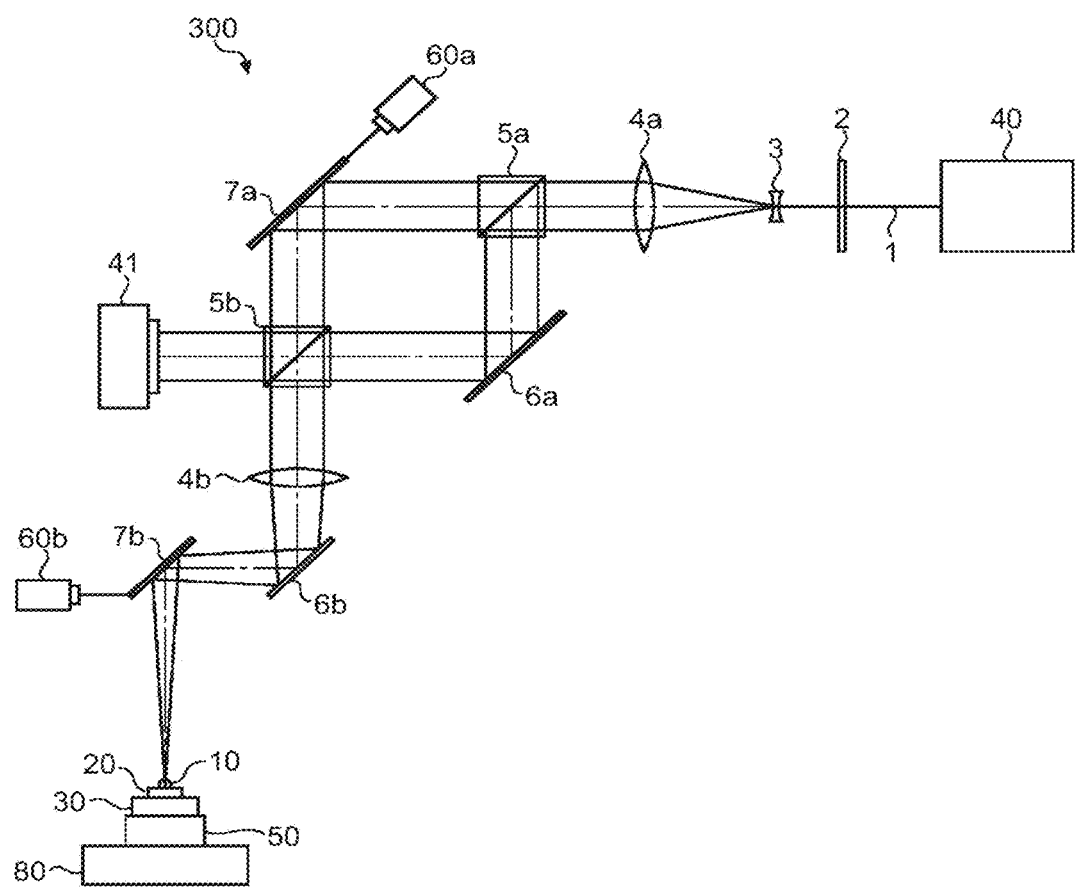
FIG. 10 is a schematic diagram showing an optical system according to a third embodiment.

An arrangement of an optical system according to the third embodiment is shown in FIG. 10 wherein a controller system are omitted and can correspond to the controller system 101 shown in FIG. 1. Furthermore, the third embodiment, to the same structures as those of the first or second embodiment, the same reference numbers will be applied, and the redundant explanations thereof will be omitted.

The optical system 300 according to the third embodiment is used to manipulate a laser beam 1 and comprises a laser source 40, a polarizing plate 2, a concave lens 3, convex lenses 4a and 4b, beam splitters 5a and 5b, a camera 41, fixed mirrors 6a and 6b, adjustable (scanning) mirrors 7a and 7b, scanners 60a and 60b, a lens 10, a MLS 20, a circuit board 30, a stage 50, and a stand 80. In the third embodiment, the mirrors 7a and 7b are used to redirect the laser beam 1 in scanning process. In the third embodiment, the function of the mirrors 7a and 7b could be replaced with a plate and/or a prism and/or any other element capable of scanning the laser beam 1.

Figure 11:
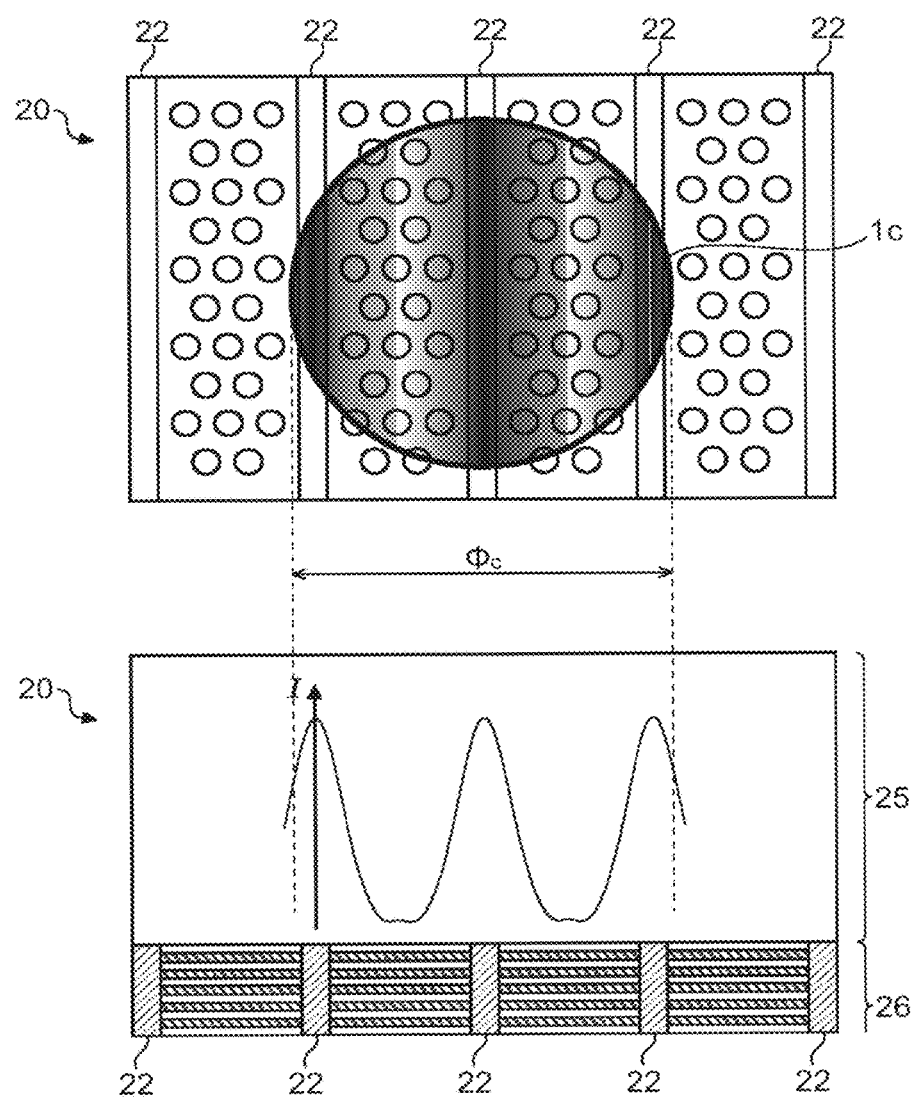
FIG. 11 is upper- and lateral-view schematic diagrams of the MLS according to the third embodiment.

In the third embodiment, an interference pattern is used in order to increase area of an irradiated zone on a preselected target region of the MLS 20. FIG. 11 shows the upper and side view of the MLS 20 for the aligned heating configuration according to the third embodiment. Such heating configuration shown in FIG. 11 is reached after an alignment method of the third embodiment. The alignment method will be described in the following with reference to FIGS. 12, 13A and 13B.

Figure 13A:
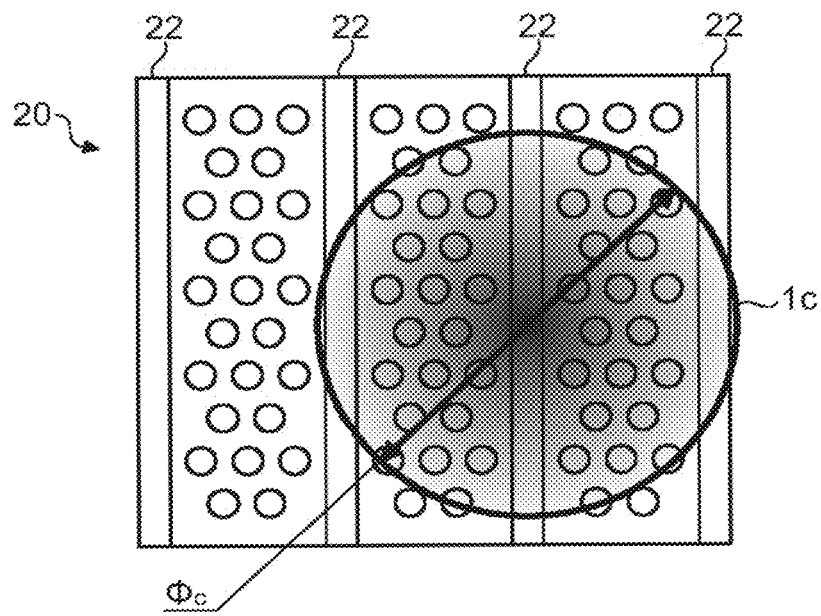
FIG. 13A is an upper-view schematic diagram of the MLS after expanding a laser beam according to the third embodiment.

FIG. 12 shows an operation of the alignment method of the third embodiment. The operation shown in FIG. 12 is started after finishing the operation described in the first embodiment with reference to FIG. 6. As shown in FIG. 12, in the operation of the third embodiment, firstly, in step S401, the laser beam 1 is first expanded to cover two or more preselected target region (i.e., two or more vertical regions 22) as shown in FIG. 13A. In FIG. 13A, an area 1c indicates an irradiated zone with the expanded laser beam 1. Here, if the unexpanded laser beam 1 covers two or more preselected target regions, step S401 can be omitted.

Then proceed to step S402, the controller system 101 adjusts the mirror 7a by driving the scanner 60a via the scanner controller 160 in order to create an interference pattern and adjust a relative pitch and a position of fringes in the interference pattern. Then proceed to step S403, the controller system 101 reads an image of the interference pattern from the camera 41.

Then proceed to step S404, the controller system 101 determines, based on the obtained image, whether the relative pitch of the fringes is reached a target relative pitch. When the relative pitch is not reached the target relative pitch (step S404; NO), the controller system 101 returns to step S402. On the other hand, when the relative pitch is reached the target relative pitch (step S404; YES), the controller system 101 proceed to step S405.

Here, visual confirmation with the aid of a microscope (capable of detecting light of wavelength λ) could also be used in step S404. Furthermore, in step S404, the controller system may also determine whether the interference pattern includes a fringe passing through the center of a beam cross-section and whether the fringes are parallel to the preselected target regions.

Figure 13B:
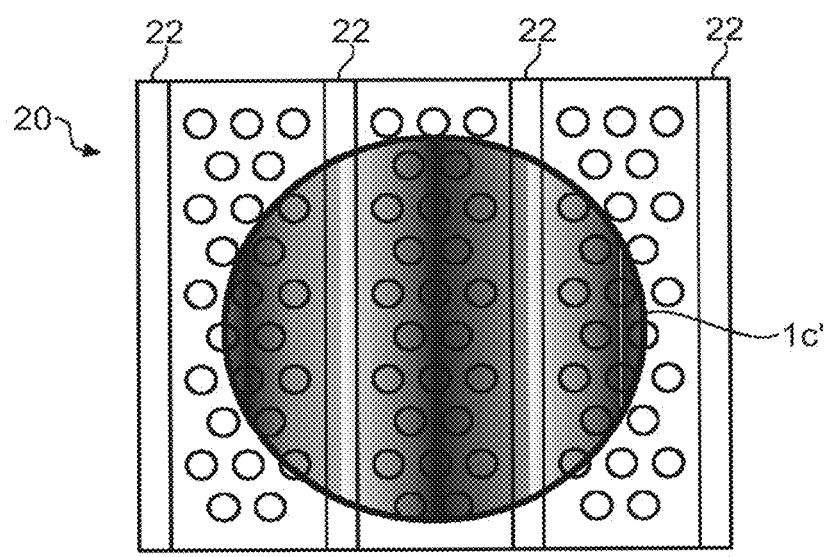
FIG. 13B is an upper-view schematic diagram of the MLS before adjusting an interference pattern on the preselected target regions.

After step S404, there is a case where the fringes in the interference pattern are parallel to the preselected target regions but do not overlap with the preselected target regions, as shown in FIG. 13B. In such case, the same alignment process as the first embodiment (described in FIGS. 5A to 5C and 6) could be conducted to obtained the aligned configuration shown in FIG. 11. In particular, as shown in step S405, the controller system 101 heats the shallow layers 26a of the MLS 20 with the irradiated zone. Then proceed to step S406, the controller system 101 registers electrical signals or electrical signal changes inputted via the amplifier 130. Then proceed to step S407, the controller system 101 verifies whether the electrical signals or the electrical signal changes reach peaks. When the electrical signals or the electrical signal changes do not reach the peaks (step S407; NO), the controller system 101 returns to step S402. On the other hand, when the electrical signals or the electrical signal changes reach the peaks (step S407; YES), the controller system 101 proceeds to step S409.

In step S408, the controller system 101 adjusts the power intensity so as to maximize the electric signals or electric signal changes. This adjustment is optional as the first embodiment.

In this way, the alignment of the third embodiment for scanning the MLS 20 to find the location of the possible fault is performed. Here, steps S403 and S404 or steps S405 to 407 in FIG. 12 can be omitted. That is, the desired aligned configuration in the third embodiment can be obtained based on one of visual confirmation corresponding to steps S403 and 404 and the reading the electrical signal corresponding to steps S405 to S407.

Figure 14:
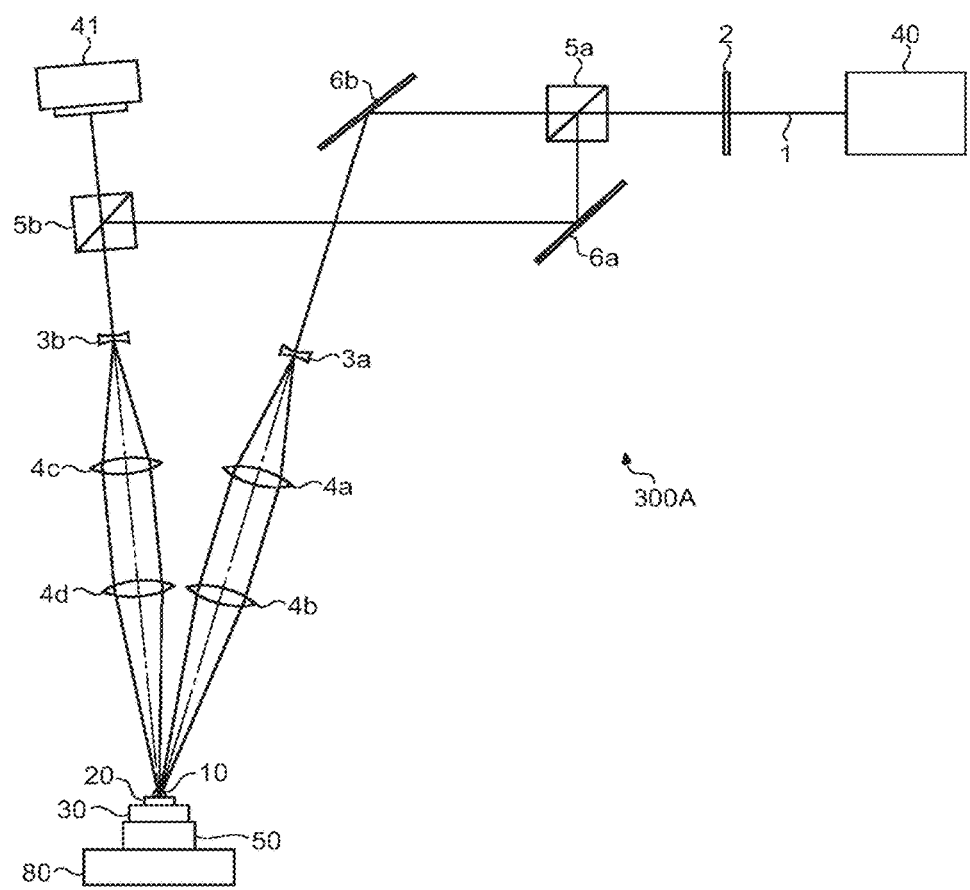
FIG. 14 is a schematic diagram showing an optical system according to one variation of the third embodiment.

In the third embodiment, any kind of optical system capable of delivering an interference patter could be used to create the desired heating configuration of the preselected target regions. A variation of the third embodiment is shown in FIG. 14. In FIG. 14, to the same structures as those of the third embodiment, the same reference numbers will be applied, and the redundant explanations thereof will be omitted. As shown in FIG. 14, the optical system 300A is used to manipulate a laser beam 1 and comprises a laser source 40, a polarizing plate 2, concave lenses 3a and 3b, convex lenses 4a to 4d, beam splitters 5a and 5b, a camera 41, fixed mirrors 6a and 6b, a lens 10, a MLS 20, a circuit board 30, a stage 50, and a stand 80.

In the variation of the third embodiment shown in FIG. 14, all the optical elements are fixed so that the scanning procedure is replaced with a translation of the MLS 20 with the stage 50. However, this would increase the measurement time in comparison with a scanning procedure conducted with the optical element 6 and the scanner 60 of the first embodiment.

In the above-described embodiments, although the multilayer flash memory is described as an example of the MLS 20, another multilayer semiconductor such as a CPU processor, a MEMS device such as a capacitance acceleration sensor, an electromagnetic sensor, or the like, a multilayer capacitor, or the like, can also be used as the MLS 20.

While certain embodiments have been described, these embodiments have been presented by way of example only, and are not intended to limit the scope of the inventions. Indeed, the novel embodiments described herein may be embodied in a variety of other forms, furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An apparatus for detecting locations of faults in a multilayer semiconductor (MLS), comprising:
a laser source that outputs a laser beam;
an optical system that directs the laser beam selectively onto a target region in the MLS to generate an irradiated zone in the MLS, the target region being made of a material of which thermal conductivity is higher than that of a material around the target region and having a structure penetrating from shallow layers to deep layers of the MLS;
a stage and a scanner that control a relative position between the irradiated zone and the MLS so that the irradiated zone moves along the target region; and
a controller system that measures electrical signals or electrical signal changes induced by a temperature increase in the MLS, and identifies a location of the target region and locations of faults in the MLS based on the measured electrical signal or the measured electrical signal changes.

2. The apparatus according to claim 1, wherein the controller system determines the relative position based on the electrical signal changes and controls the stage and the scanner in accordance with the determined relative position.

3. The apparatus according to claim 1, further comprising an amplifier that increases the electrical signals or the electrical signal changes, wherein
the controller system measures the increased electrical signals or the increased electrical signal changes and identifies the locations of the faults in the MLS based on the increased electrical signal or the increased electrical signal changes.

4. The apparatus according to claim 3, wherein the amplifier is operable to detect the electrical signals or the electrical signal changes depending on a temperature profile of the MLS.

5. The apparatus according to claim 3, wherein amplifier is adjusted to detect the electrical signals or the electrical signal changes for individual layers in order to detect a depth of each fault and/or a layer where at least one fault is located.

6. The apparatus according to claim 1, further comprising a camera that measures a location of the irradiated zone on the MLS, wherein
the controller system controls the stage and the scanner so that the measured location of the irradiated zone moves along the target region.

7. The apparatus according to claim 1, wherein the laser source outputs the laser beam with an infrared wavelength which is semi-transparent against a substrate material of the MLS.

8. The apparatus according to claim 1, wherein the optical system directs the laser beam onto the target region through a substrate of the MLS so that the irradiated zone is created in a shallower layer of the MLS.

9. The apparatus according to claim 1, wherein the optical system includes an optical component for adjusting a numerical aperture of the optical system so that a size of the irradiated zone has a comparable size to the target region.

10. The apparatus according to claim 1, wherein the optical system includes a diffraction grating for creating a diffraction pattern that increases the number of irradiated zones on the target region.

11. The apparatus according to claim 1, wherein the optical system includes one or more prism for creating an interference pattern that increases the number of irradiated zones on the target region.

12. A method of detecting locations of faults in a multilayer semiconductor (MLS), comprising:
outputting a laser beam;
directing the laser beam selectively onto a target region in the MLS to generate an irradiated zone in the MLS, the target region being made of a material of which thermal conductivity is higher than that of a material around the target region and having a structure penetrating from shallow layers to deep layers of the MLS;
controlling a relative position between the irradiated zone and the MLS so that the irradiated zone moves along the target region;
measuring electrical signals or electrical signal changes induced by a temperature increase in the MLS; and
identifying a location of the target region and locations of faults in the MLS based on the measured electrical signal or the measured electrical signal changes.

13. A non-transitory computer readable medium having a program for detecting locations of faults in a multilayer semiconductor (MLS), the program including instructions of:
outputting a laser beam;
directing the laser beam selectively onto a target region in the MLS to generate an irradiated zone in the MLS, the target region being made of a material of which thermal conductivity is higher than that of a material around the target region and having a structure penetrating from shallow layers to deep layers of the MLS;
controlling a relative position between the irradiated zone and the MLS so that the irradiated zone moves along the target region;
measuring electrical signals or signal changes induced by a temperature increase in the MLS, and identifying a location of the target region and locations of faults in the MLS based on the measured electrical signal or the measured electrical signal changes.

\* \* \* \* \*